United States Patent
Darmawikarta et al.

(10) Patent No.: US 9,820,386 B2
(45) Date of Patent: Nov. 14, 2017

(54) PLASMA ETCHING OF SOLDER RESIST OPENINGS

(71) Applicant: Intel Corporation, Santa Clara, CA (US)

(72) Inventors: Kristof Darmawikarta, Chandler, AZ (US); Rahul Jain, Gilbert, AZ (US); Robert Alan May, Chandler, AZ (US); Sheng Li, Gilbert, AZ (US); Sri Ranga Sai Boyapati, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/074,064

(22) Filed: Mar. 18, 2016

(65) Prior Publication Data
US 2017/0273187 A1   Sep. 21, 2017

(51) Int. Cl.
  H05K 3/00    (2006.01)
  H05K 1/09    (2006.01)
  H05K 1/03    (2006.01)

(52) U.S. Cl.
  CPC .......... *H05K 3/0041* (2013.01); *H05K 1/0313* (2013.01); *H05K 1/09* (2013.01);
  (Continued)

(58) Field of Classification Search
  CPC ..................... H05K 3/0041; H05K 3/0055
  See application file for complete search history.

(56) References Cited

U.S. PATENT DOCUMENTS

| | | | | |
|---|---|---|---|---|
| 5,744,285 A | * | 4/1998 | Felten ................... | H05K 1/095 430/318 |
| 6,838,387 B1 | * | 1/2005 | Zajac ................ | H01J 37/32082 257/E21.218 |

(Continued)

FOREIGN PATENT DOCUMENTS

JP    2007311688 A    11/2007
KR   1020030008531 A   1/2003
(Continued)

OTHER PUBLICATIONS

"International Application Serial No. PCT/US2017/018195, International Search Report dated May 31, 2017", 3 pgs.

(Continued)

*Primary Examiner* — Duy Deo
(74) *Attorney, Agent, or Firm* — Schwegman Lundberg & Woessner, P.A.

(57) ABSTRACT

A method of forming an electronic assembly. The method includes covering a patterned conductive layer that is on a dielectric layer with a solder resist; depositing a metal layer on to the solder resist; depositing a photo resist onto the metal layer; patterning the photo resist; etching the metal layer that is exposed from the photo resist to form a metal mask; removing the photo resist; and plasma etching the solder resist that is exposed from the metal mask. An electronic assembly for securing for an electronic card. The electronic assembly includes a patterned conductive layer that is on a dielectric layer; and a solder resist covering the patterned conductive layer and the dielectric layer, wherein the solder resist includes openings that expose the patterned conductive layer, wherein the openings in the solder resist only have organic material on side walls of the respective openings.

14 Claims, 5 Drawing Sheets

(52) U.S. Cl.
CPC ... *H05K 3/0055* (2013.01); *H05K 2203/0502* (2013.01); *H05K 2203/0548* (2013.01); *H05K 2203/0562* (2013.01)

(56) References Cited

U.S. PATENT DOCUMENTS

| | | | |
|---|---|---|---|
| 2003/0071014 A1 | 4/2003 | Maa et al. | |
| 2007/0096328 A1* | 5/2007 | Takahashi | H05K 1/115 257/774 |
| 2013/0280904 A1* | 10/2013 | Shi | H01L 21/78 438/613 |

FOREIGN PATENT DOCUMENTS

| | | |
|---|---|---|
| KR | 101432446 B1 | 8/2014 |
| WO | WO-2011090114 A1 | 7/2011 |

OTHER PUBLICATIONS

"International Application Serial No. PCT/US2017/018195, Written Opinion dated May 31, 2017", 7 pgs.

\* cited by examiner

ADD SOLDER RESIST

DEPOSIT METAL LAYER

PLASMA ETCHING OF SOLDER RESIST OPENINGS

BACKGROUND

Conventional semi-additive processes (SAPs) commonly laminate a photosensitive solder resist (SR) material on to metal layers that are on one (or both) sides of a dielectric material. An electrical connection with the metal layer(s) is typically formed through the SR material by exposing the SR material with ultraviolet radiation to cross-link selected (i.e., patterned) areas on the SR material. The unexposed areas on the SR material are then usually removed to form solder resist openings (SRO).

Reducing the size and pitch of the SROs is typically quite difficult because of the complex interplay between material properties, exposure, and development tools. One of these difficulties includes UV light scattering on rough pad (e.g., copper) surfaces which limits the accuracy of the SR footprint thereby making it difficult to minimize the size of the SRO. In addition, the numerical aperture of the UV projection tool also limits the resolution of the SR footprint thereby making it difficult to minimize the size of the SRO.

Another common difficulty relates to limited etching solution flow within the SROs. This limited etching solution flow commonly prevents full development of high aspect ratio SROs.

Another common approach to fabricating SROs relates to utilizing UV laser drilling. UV laser drilling can potentially create 20 um SRO. However, UV laser drilling is typically very slow and negatively impacts the throughput of electronic assemblies that are fabricated using UV drilling due to the slow UV laser drilling. Any reduction in throughput may negatively impact the cost associated with fabricating electronic assemblies.

Many electronic assemblies include SROs of more than one size. These types of electronic assemblies are typically fabricated utilizing two different process steps. The first process step commonly uses standard UV exposure to form large SROs. The second process step usually uses standard UV laser drilling to form small SROs. The need for different process steps to fabricate electronic assemblies that include different sized SROs decreases manufacturing throughput due to the slow UV laser drilling and the need for multiple process steps.

DETAILED DESCRIPTION

The following detailed description references the accompanying drawings. Like numerals describe substantially similar components throughout each of the drawings. Other embodiments may be used, and structural, logical, and electrical changes made. The integrated circuit described herein can be manufactured, used, or shipped in a number of positions and orientations.

The electronic assemblies described herein may be implemented in a number of different embodiments, including an electronic package, an electronic system, a computer system, one or more methods of fabricating an integrated circuit, and one or more methods of fabricating an electronic assembly that includes the integrated circuit. The elements, materials, geometries, dimensions, and sequence of operations can all be varied to suit particular packaging requirements.

The methods described herein plasma etch a solder resist to form SROs where a metal layer (e. g. a thin film copper layer) is used as a mask during fabrication. In some forms, the mask may be patterned by lithography and/or copper etching techniques. Plasma etching allows small SROs to be formed and permits simultaneous formation of large and small SROs.

Plasma etching may permit higher resolution fabrication of SROs than conventional resist lithography. The higher resolution may potentially allow for the formation of much smaller SROs.

In addition, when an electronic assembly requires SROs of multiple size, a single plasma etching process may be performed instead of the conventional multi-step UV exposure and laser drilling processes which are only capable of forming multi-size SROs of the same size. Plasma etching may also remove the need for photosensitive components in the SR material. Removing photosensitive components from the SR material may allow material engineers to improve other desirable material properties of the SR.

In some forms, a thin film metal layer (e.g., copper) serves as an etching mask on the surface of SR. A photo resist is then deposited on the copper film and subsequently patterned. As an example, a separate $CO_2$ laser drill may be used to open a thin copper film in order to expose underlying fiducials through the copper film. The fiducials may need to be exposed through the thin copper film so that the photo resist patterning may be aligned relative to the exposed fiducials. The openings in the photo resist may allow etching of the copper film underneath in order to form a mask.

Once the mask is formed, the photo resist may be stripped. It should be noted that leaving the photo resist on the copper mask may be detrimental to the plasma etching efficiency due to a resin loading effect (i.e., radicals may be consumed on the top surface). The SRO is formed only where the copper mask is open such that the copper pad underneath acts as an etch stop. Once plasma etch is completed, the copper mask may be etched away with the substrate being prepared for any further desired surface finish processes.

Figure 1:
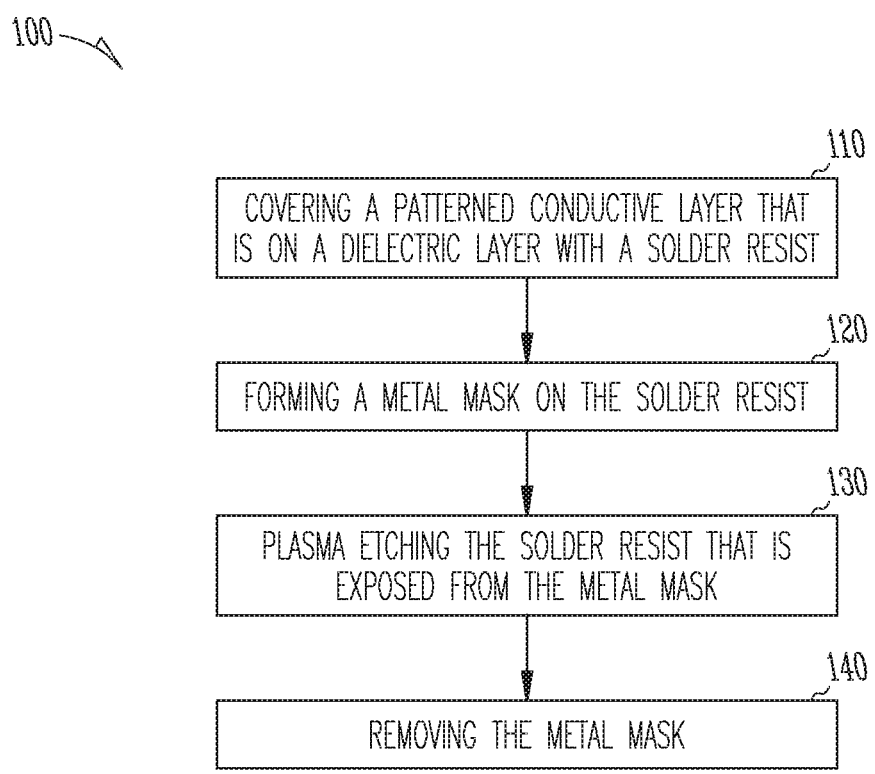
FIG. 1 is a flow diagram illustrating an example method of fabricating an electronic assembly.

FIG. 1 is a flow diagram illustrating an example method [100] of forming an electronic assembly 10. FIGS. 2A-2I are schematic diagrams illustrate an example method of fabricating the electronic assembly 10.

Figure 2A:
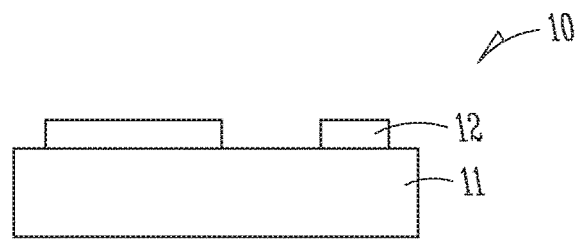
FIGS. 2A-2I are schematic diagrams illustrate an example method of fabricating an electronic assembly.
Figure 2B:
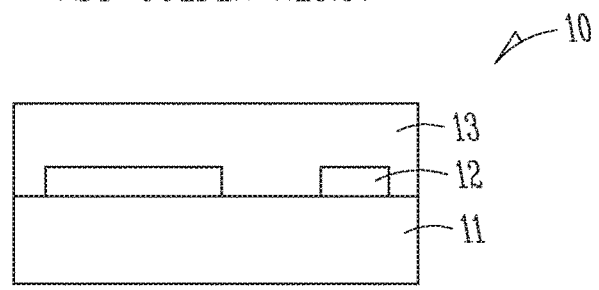

The method [100] includes [110] covering a patterned conductive layer 12 that is on a dielectric layer 11 with a solder resist 13 (see FIG. 2B). The method further includes [120] forming a metal mask 16 on the solder resist 13 (see FIGS. 2F-2I). The method [100] further includes [130] plasma etching the solder resist 13 that is exposed from the metal mask 16 (see FIG. 2H).

Figure 2C:
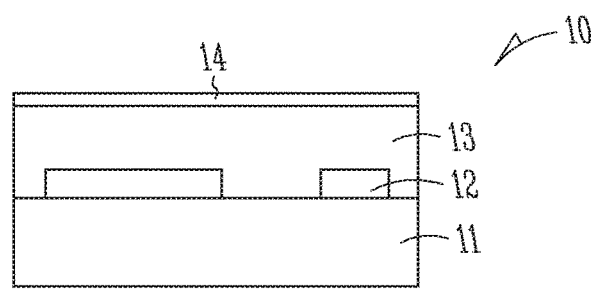
Figure 2D:
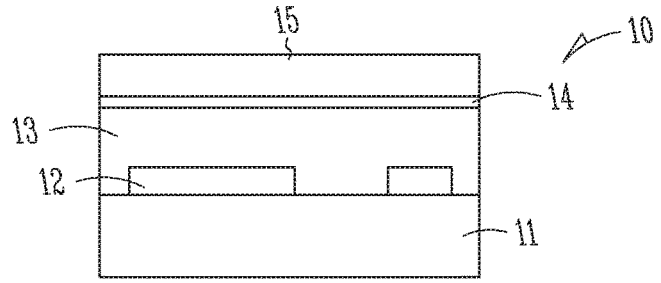
Figure 2E:
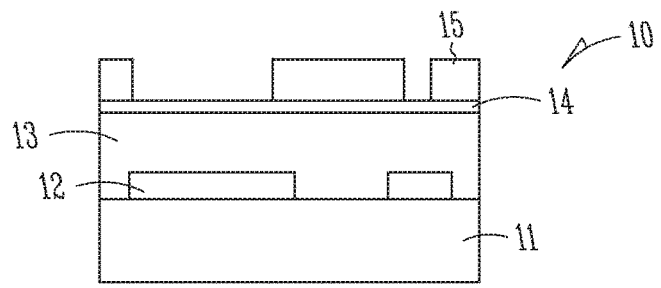
Figure 2F:
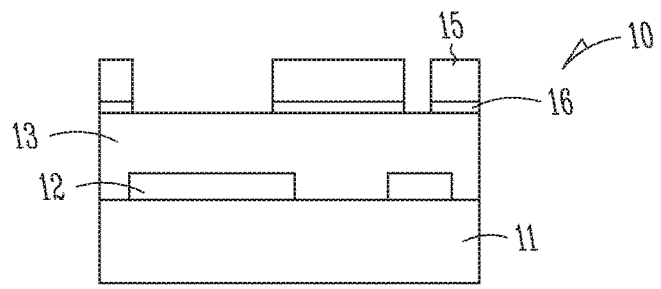
Figure 2G:
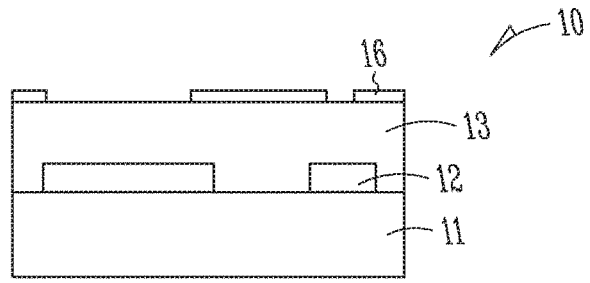
Figure 2H:
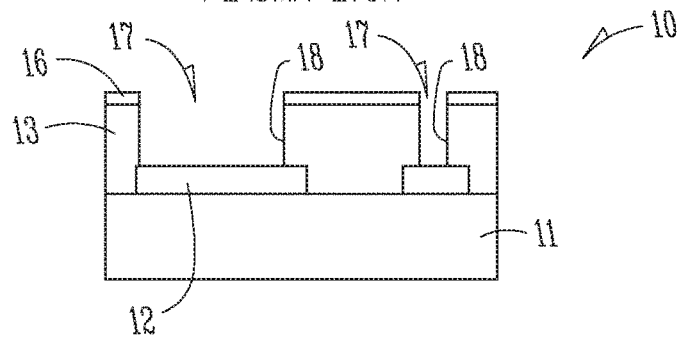
Figure 2I:
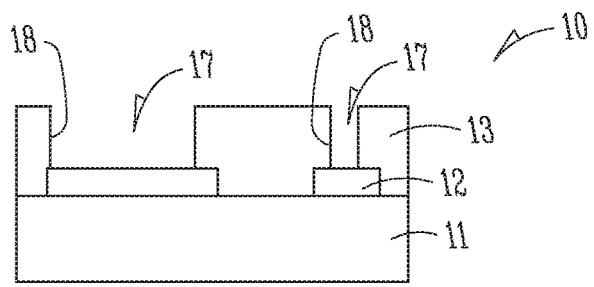

In some forms, the method [100] may further include [140] removing the metal mask 16 (see FIG. 2I). As an example, the metal mask 16 may be removed using wet etching (e.g., using a copper chloride or a sulfuric acid based solution). It should be noted that [140] removing the metal mask 16 may be performed in any manner that is known now, or discovered in the future (e. g, dry etching). The type of process that is used to remove the metal mask 16 will depend in part on the type of material that is used for the metal mask 16 and other manufacturing considerations (among other factors).

In some forms, [120] forming a metal mask 16 on the solder resist 13 may include depositing a metal layer 14 onto the solder resist 13 (see FIG. 2C). It should be noted that the metal layer 14 may be deposited onto the solder resist 13 in any manner that is known now, or discovered in the future (e.g., by sputtering or electroless plating).

In addition, [120] forming a metal mask 16 on the solder resist 13 may include depositing a photoresist 15 onto the metal layer 14 (see FIG. 2D). The type of photoresist 15 that is deposited onto the metal layer 14 will depend in part on the type of metal layer 14 that is included in electronic assembly 10 as well as other manufacturing considerations (among other factors).

In some forms, [120] forming a metal mask 16 on the solder resist 13 may include patterning the photoresist 15 (see FIG. 2E). As an example, the photoresist 15 may be patterned using a UV exposure when the photoresist is a dry film resist. The photoresist 15 may be patterned in any manner that is known now, or discovered in the future. The type of patterning that is done to the photoresist 15 will depend in part on the materials that are used for the photoresist 15 and the metal layer 14 (among other factors).

As shown in FIG. 2F, [120] forming a metal mask 16 on the solder resist 13 may include etching the metal layer 14 that is exposed from the photoresist 15 to form the metal mask 16. It should be noted that portions of the metal layer 14 may be etched (or otherwise removed) to form the metal mask 16 in any manner that is known now, or discovered in the future. The manner in which portions of the metal layer 14 are removed to form the metal mask 16 will depend in part on the type of material that is used for the metal layer 14 and the photoresist 15 as well as other manufacturing considerations (among other factors).

In addition, [120] forming a metal mask 16 on the solder resist 13 may including removing the photoresist 15 after etching the metal layer 14 (see FIG. 2G). It should be noted that the photoresist 15 may be removed in any manner that is known now, or discovered in the future. The manner in which the photoresist 15 is removed from the metal mask 16 will depend in part on the type of material that is used for the photoresist 15 (among other factors).

As shown in FIGS. 2H-2I, [130] plasma etching the solder resist 13 that is exposed from the metal mask 16 may include forming openings 17 in the solder resist 13. It should be noted that forming openings 17 in the solder resist 13 may include forming openings 17 in the solder resist that have different (or the same) size openings 17. It is typically not possible to manufacture electronic assemblies that include SROs of more than one size (where one of the SROs is less than 25 microns) without utilizing two different process steps. The elimination of the need discussed above for different process steps to fabricate electronic assemblies that include different sized SROs by performing the fabrication of different sized SROs in a single process step may desirably increase manufacturing throughput.

As an example, forming openings 17 in the solder resist 13 may include forming openings 17 that are less than 25 microns in diameter. The number and type of openings 17 that are formed in the solder resist 13 will depend in part on the overall architecture of the electronic assembly 10 (among other factors).

In some forms, [130] plasma etching solder resist 13 that is exposed from the metal mask 16 may include reactive ion etching the solder resist 13. As an example, [113] plasma etching solder resist 13 that is exposed from the metal mask 16 may include using fluorine and oxygen containing plasma to etch the solder resist 13. Some plasma etching gases include xenon difluoride, NE3, CF4, SF6 in combination with oxygen. The type of plasma etching that is utilized to form openings 17 in the solder resist 13 will depend in part on the type of material that is used for the solder resist 13 and the metal layer 12 (among other factors).

Figure 3:
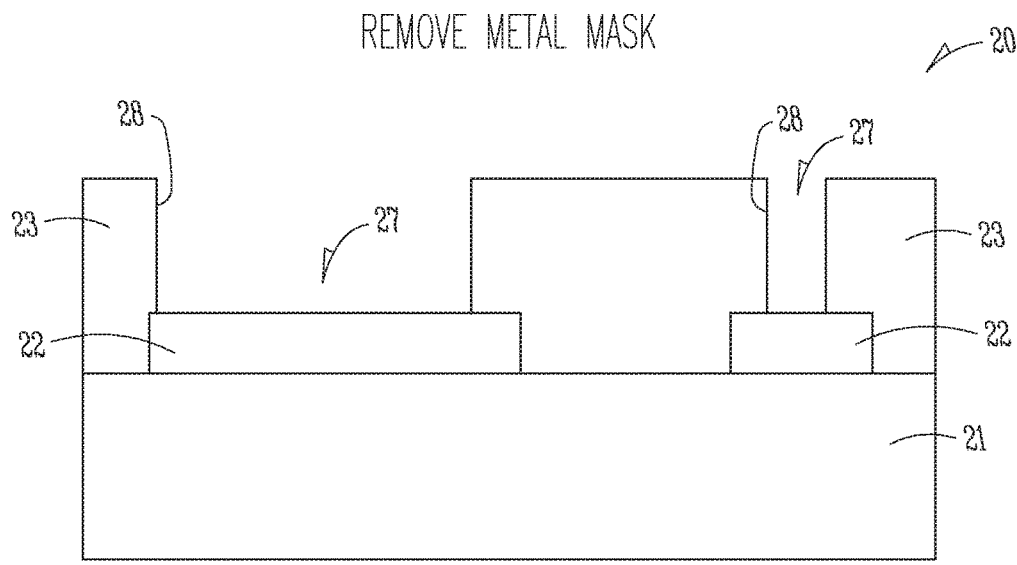
FIG. 3 is a schematic side view of another example electronic assembly.

FIG. 3 is a schematic side view of another example electronic assembly 20. The electronic assembly 20 includes a patterned conductive layer 22 that is on a dielectric layer 21.

The electronic assembly 20 further includes a solder resist 23 that covers the patterned conductive layer 22 and the dielectric layer 21. The solder resist 23 includes openings 27 that expose the patterned conductive layer 22. The openings 27 in the solder resist 23 have only organic material on side walls 28 of the respective openings 27.

The solder resist 23 may be without a photosensitive component. If the solder resist 23 does not include a photosensitive component, then the material selection for, and or fabrication of, the electronic assembly 20 may be facilitated.

In some forms, the patterned conductive layer 22 may be copper. The type of material that is used for the patterned conductive layer 22 will depend in part on the manufacturing considerations that are associated with fabricating the electronic assembly 20.

As an example, the organic material on the side walls 28 of the respective openings 27 may be an epoxy. It should be noted that any type of organic material that is known now, or discovered in the future may be on the side walls 28 of the respective openings 27. The type of organic material that is on the side walls 28 of the respective openings 27 will depend in part on the type of solder resist 23 that is included in the electronic assembly 20 (among other factors).

It should be noted that the solder resist 23 may include silica fillers that are not exposed on the respective side walls 28 of the openings 27 in the solder resist 23. As an example, the silica fillers that are otherwise included in the solder resist 23 are not be exposed on the side walls 28 of the openings 27 because the openings 27 are formed by plasma etching the solder resist 23 (i.e., the silica fillers are removed from the opening by plasma etching). When using conventional techniques similar types of openings include both silica and organic material because the silica fillers are not etching by existing wet etching processes.

As an example, the plasma etching may be done by a reactive ion etching plasma etching system that removes via residue and is capable of etching epoxy and silica fillers at the same rate (e.g., with an NF3 and O2 gas mixture). This type of plasma etching system may provide effective removal of the organic epoxy on the patterned conductive layer 22 with relatively minimal etch time (e.g., less than 5 minutes as compared to 15 minutes using conventional wet etching techniques depending on geometry) and potentially no additional treatment to remove filler. The type of plasma may be optimized to clean openings 27.

Figure 4:
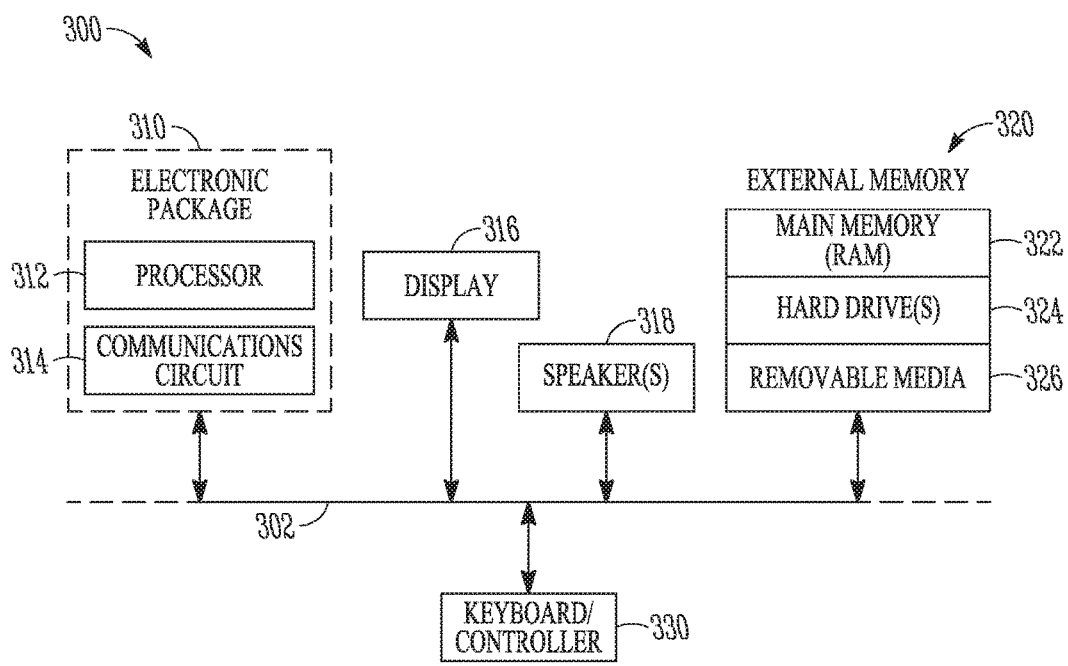
FIG. 4 is block diagram of an electronic apparatus that utilizes the methods and/or includes the electronic assemblies described herein.

FIGS. 2-4 are merely representational and are not drawn to scale. Certain proportions thereof may be exaggerated while others may be minimized.

The methods and electronic assemblies described herein may provide SRO with different properties because the SRO is formed by plasma etching. As an example, the sidewalls of the SRO may be fabricated with relatively less taper as compared to SROs that are formed using UV exposure and/or laser drilling. In addition, plasma etched SROs may potentially be fabricated with a higher aspect ratio than SROs that are formed by either UV exposure or laser drilling. As an example, openings formed by plasma etching may have an aspect ratio greater than 1 to 1—which is the typical aspect ratio for openings that are formed using conventional techniques.

Depending on the type of plasma etching and the type of solder resist that is used in the methods and electronic assemblies described herein, the sidewalls of the SRO may not include any fillers (e.g., silica fillers). As an example, when the plasma etching is performed using a fluorine and oxygen containing plasma, the silica fillers may be etched away from SRO side wall.

FIG. 4 is a block diagram of an electronic apparatus 400 incorporating at least one method and/or electronic assembly described herein. Electronic apparatus 400 is merely one example of an electronic apparatus in which forms of the methods and/or electronic assemblies described herein may be used. Examples of an electronic apparatus 400 include, but are not limited to, personal computers, tablet computers, mobile telephones, wearables, game devices, MP4 or other digital music players, etc.

In this example, electronic apparatus 400 comprises a data processing system that includes a system bus 402 to couple the various components of the electronic apparatus 400. System bus 402 provides communications links among the various components of the electronic apparatus 400 and may be implemented as a single bus, as a combination of busses, or in any other suitable manner.

An electronic assembly 410 as described herein may be coupled to system bus 402. The electronic assembly 410 may include any circuit or combination of circuits. In one embodiment, the electronic assembly 410 includes a processor 412 which can be of any type. As used herein, "processor" means any type of computational circuit, such as but not limited to a microprocessor, a microcontroller, a complex instruction set computing (CISC) microprocessor, a reduced instruction set computing (RISC) microprocessor, a very long instruction word (VLIW) microprocessor, a graphics processor, a digital signal processor (DSP), multiple core processor, or any other type of processor or processing circuit.

Other types of circuits that may be included in electronic assembly 410 are a custom circuit, an application-specific integrated circuit (ASIC), or the like, such as, for example, one or more circuits (such as a communications circuit 414) for use in wireless devices like mobile telephones, tablet computers, laptop computers, two-way radios, and similar electronic systems. The IC can perform any other type of function.

The electronic apparatus 400 may also include an external memory 420, which in turn may include one or more memory elements suitable to the particular application, such as a main memory 422 in the form of random access memory (RAM), one or more hard drives 424, and/or one or more drives that handle removable media 426 such as compact disks (CD), flash memory cards, digital video disk (DVD), and the like.

The electronic apparatus 400 may also include a display device 416, one or more speakers 418, and a keyboard and/or controller 440, which can include a mouse, trackball, touch screen, voice-recognition device, or any other device that permits a system user to input information into and receive information from the electronic apparatus 400.

To better illustrate the electronic assemblies disclosed herein, a non-limiting list of examples is provided here:

Example 1 includes method of forming an electronic assembly. The method includes covering a patterned conductive layer that is on a dielectric layer with a solder resist; forming a metal mask on the solder resist; and plasma etching the solder resist that is exposed from the metal mask.

Example 2 includes the method of example 1, and further including removing the metal mask.

Example 3 includes the method of any one of examples 1-2, wherein forming a metal mask on the solder resist includes depositing a metal layer on to the solder resist.

Example 4 includes the method of any one of examples 1-3, wherein forming a metal mask on the solder resist includes depositing a photo resist onto the metal layer.

Example 5 includes the method of any one of examples 1-4, wherein forming a metal mask on the solder resist includes patterning the photo resist.

Example 6 includes the method of any one of examples 1-5, wherein forming a metal mask on the solder resist includes etching the metal layer that is exposed from the photo resist to form the metal mask.

Example 7 includes the method of any one of examples 1-6, wherein forming a metal mask on the solder resist includes removing the photo resist after etching the metal layer.

Example 8 includes the method of any one of examples 1-7, wherein plasma etching the solder resist that is exposed from the metal mask includes forming openings in the solder resist.

Example 9 includes the method of any one of examples 1-8, wherein forming openings in the solder resist includes forming different size openings in the solder resist.

Example 10 includes the method of any one of examples 1-9, wherein forming openings in the solder resist includes forming openings that are less than 25 microns in diameter and additional openings that are less than 50 microns.

Example 11 includes the method of any one of examples 1-10, wherein plasma etching the solder resist that is exposed from the metal mask includes reactive ion etching the solder resist.

Example 12 includes the method of any one of examples 1-11, wherein plasma etching the solder resist that is exposed from the metal mask includes using fluorine and oxygen containing plasma to etch the solder resist.

Example 13 includes an electronic assembly for securing for an electronic card. The electronic assembly includes a patterned conductive layer that is on a dielectric layer; and a solder resist covering the patterned conductive layer and the dielectric layer, wherein the solder resist includes openings that expose the patterned conductive layer, wherein the openings in the solder resist only have organic material on side walls of the respective openings.

Example 14 includes the electronic assembly of example 13, wherein the patterned conductive layer is copper.

Example 15 includes the electronic assembly of any one of examples 13-14, wherein the solder resist is without a photosensitive component.

Example 16 includes the electronic assembly of any one of examples 13-15, wherein the solder resist includes silica fillers that are not exposed on the side walls of the openings in the solder resist.

Example 17 includes method of forming an electronic assembly. The method includes covering a patterned conductive layer that is on a dielectric layer with a solder resist; depositing a metal layer on to the solder resist; depositing a photo resist onto the metal layer; patterning the photo resist; etching the metal layer that is exposed from the photo resist to form a metal mask; removing the photo resist; and plasma etching the solder resist that is exposed from the metal mask.

Example 18 includes the method of example 17, and further including removing the metal mask.

Example 19 includes the method of any one of examples 17-18, wherein plasma etching the solder resist that is exposed from the metal mask includes forming openings in the solder resist, wherein forming openings in the solder resist includes forming different size openings in the solder resist where some of the openings are less than 25 microns in diameter.

Example 20 includes the method of any one of examples 17-19, wherein plasma etching the solder resist that is exposed from the metal mask includes reactive ion etching the solder resist using fluorine and oxygen containing plasma to etch the solder resist.

This overview is intended to provide non-limiting examples of the present subject matter—it is not intended to provide an exclusive or exhaustive explanation. The detailed description is included to provide further information about the systems; and methods.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 CFR. §1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. A method of forming an electronic assembly comprising:
   covering a patterned conductive layer that is on a dielectric layer with a solder resist;
   forming a metal mask on the solder resist;
   plasma etching the solder resist that is exposed from the metal mask; and
   removing the entire metal mask.

2. The method of claim 1 wherein forming a metal mask on the solder resist includes depositing a metal layer on to the solder resist.

3. The method of claim 2 wherein forming a metal mask on the solder resist includes depositing a photo resist onto the metal layer.

4. The method of claim 3 wherein forming a metal mask on the solder resist includes patterning the photo resist.

5. The method of claim 4 wherein forming a metal mask on the solder resist includes etching the metal layer that is exposed from the photo resist to form the metal mask.

6. The method of claim 5 wherein forming a metal mask on the solder resist includes removing the photo resist after etching the metal layer.

7. The method of claim 1 wherein plasma etching the solder that is exposed from the metal mask includes forming openings in the solder resist.

8. The method of claim 7 wherein forming openings in the solder resist includes forming different size openings in the solder resist.

9. The method of claim 7 wherein forming openings in the solder resist includes forming openings that are less than 25 microns in diameter and additional openings that are less than 50 microns.

10. The method of claim 1 wherein plasma etching the solder resist that is exposed from the metal mask includes reactive ion etching the solder resist.

11. The method of claim 1 wherein plasma etching the solder resist that is exposed from the metal mask includes using fluorine and oxygen containing plasma to etch the solder resist.

12. A method of forming an electronic assembly comprising:
    covering a patterned conductive layer that is on a dielectric layer with a solder resist;
    depositing a metal layer on to the solder resist;
    depositing a photo resist onto the metal layer;
    patterning the photo resist;
    etching the metal layer that is exposed from the photo resist to form a metal mask;
    removing the photo resist;
    plasma etching the solder resist that is exposed from the metal mask; and
    removing the entire metal mask.

13. The method of claim 12 wherein plasma etching the solder resist that is exposed from the metal mask includes forming openings in the solder resist, wherein forming openings in the solder resist includes forming different size openings in the solder resist where some of the openings are less than 25 microns in diameter.

14. The method of claim 12 wherein plasma etching the solder resist that is exposed from the metal mask includes reactive ion etching the solder resist using fluorine and oxygen containing plasma to etch the solder resist.

\* \* \* \* \*